(12) United States Patent
Lee

(10) Patent No.: US 7,619,449 B2
(45) Date of Patent: Nov. 17, 2009

(54) METHOD AND APPARATUS FOR SYNCHRONOUS CLOCK DISTRIBUTION TO A PLURALITY OF DESTINATIONS

(75) Inventor: Seong Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 11/759,782

(22) Filed: Jun. 7, 2007

(65) Prior Publication Data

US 2008/0303570 A1 Dec. 11, 2008

(51) Int. Cl.
*H03L 7/00* (2006.01)
*G06F 1/12* (2006.01)
(52) U.S. Cl. .............. 327/141; 327/149; 713/375; 713/400; 713/500; 713/600
(58) Field of Classification Search ......... 327/156–158, 327/291, 295; 713/400, 500
See application file for complete search history.

(56) References Cited

U.S. PATENT DOCUMENTS

| | | | |
|---|---|---|---|
| 6,137,327 A | 10/2000 | Schnell | |
| 6,208,702 B1 * | 3/2001 | Ghoshal | 375/354 |
| 6,456,130 B1 | 9/2002 | Schnell | |
| 6,667,645 B1 * | 12/2003 | Fletcher et al. | 327/200 |
| 6,842,399 B2 * | 1/2005 | Harrison | 365/189.07 |
| 6,867,616 B1 | 3/2005 | Venkata et al. | |
| 6,918,047 B1 | 7/2005 | Sita et al. | |
| 6,943,610 B2 * | 9/2005 | Saint-Laurent | 327/295 |
| 6,959,396 B2 * | 10/2005 | Chen et al. | 713/500 |
| 7,317,342 B2 * | 1/2008 | Saint-Laurent | 327/295 |
| 7,464,284 B2 * | 12/2008 | Arnold et al. | 713/503 |

OTHER PUBLICATIONS

Zilic, Zeljko, "Phase- and Delay-Locked Loop Clock Control in Digital Systems," EDA Design Line <<http://www.edadesignline.com/showArticle.jhtml;jsessionid=EJAGCES43SIKIQSNDLPSK...>>Aug. 17, 2001, 4 pages.
"DLL/PLL on a DRAM," Rambus, <<http://www.rambus.com/us/patents/innovations/detail/dll_pll.html>> 2007,4 pages.

* cited by examiner

*Primary Examiner*—Vibol Tan
(74) *Attorney, Agent, or Firm*—TraskBritt

(57) ABSTRACT

Circuits, methods and systems are disclosed providing clock synchronization circuits for synchronized clock distribution for a plurality of devices in a semiconductor device. The clock synchronization apparatus includes an independent synchronization circuit and a dependent synchronization circuit. The independent synchronization circuit may provide synchronized clock distribution for a first destination while the dependent synchronization circuit may provide synchronized clock distribution to a second destination. A method for synchronized clock distribution to a plurality of destinations is also described.

30 Claims, 6 Drawing Sheets

METHOD AND APPARATUS FOR SYNCHRONOUS CLOCK DISTRIBUTION TO A PLURALITY OF DESTINATIONS

FIELD OF THE INVENTION

Embodiments of the present invention relate generally to a method and apparatus for clock synchronization and, more particularly, to synchronized clock distribution to a plurality of destinations.

BACKGROUND

Synchronous sequential systems, such as synchronous dynamic random access memories (SDRAMs) and specific Double Data Rate (DDR) memories, rely on globally synchronized clocks. As CPU speeds increase, low-skew clock distributions are becoming increasingly important to increase the speed at which data can be transmitted to and from semiconductor devices. Many devices commonly employ on-chip delay-lock loops (DLL) and phase-lock loops (PLL) to improve input/output timing margins by achieving low skew distributions.

FIG. 1 illustrates an example of a prior art common synchronized clock distribution circuit. A clock 102 provides a source clock signal and is input into a synchronization circuit 104. In order to synchronize the clock, a destination clock signal (feedback signal) 106 simulating a delay in the destination clock is returned to the synchronization circuit 104 and a clock signal delay through the synchronization circuit 104 is adjusted or modified until the destination clock signal 106 and the source clock signal are substantially synchronized. Furthermore, the destination clock signal 106 may be distributed to additional devices such as devices 108, 110, 112, 114.

Synchronization circuit 104 generally adequately synchronizes only a single device 112 and may additionally adequately synchronize an immediately adjacent device such as device 114. However, because the clock is only synchronized for devices 112, 114, devices 108, 110 must be designed to exhibit a substantially equivalent load such as by positioning devices 108, 110 at almost exactly the same distance from the synchronization circuit 104 and forming the delay paths and the devices from substantially similar materials and components to cause the delay to be substantially equivalent. As semiconductor chips get bigger and operate at higher frequencies, the differences in distance, materials and components between devices 108, 110 and 112, 114 may cause devices 108, 110 to be inadequately synchronized with devices 112, 114.

In order to address the problems that arise from differences in destinations, some devices have incorporated the use of an independent synchronization circuit for each different device or destination. FIG. 2 illustrates an example of a prior art synchronized clock distribution circuit employing two independent synchronization circuits with one for each destination. The first destination, including devices 108 and 110, is synchronized to the source clock signal through the first synchronization circuit 202. The second destination, including devices 112 and 114, is synchronized to the source clock signal through the second synchronization circuit 204. This solution is generally effective in providing synchronized clock distribution to all the devices. However, with electronic devices becoming more complex, circuitry area or space, also termed "real estate," in semiconductor devices is becoming more and more scarce. The solution described in FIG. 2 requires twice as much circuit area as the example in FIG. 1 since synchronization circuits are required for each of the two destinations. Furthermore, additional synchronization circuits increase costs and power consumption for the device or system in which the two circuits are utilized.

In view of the shortcomings in the prior art, it would be useful to provide a method and apparatus capable of synchronizing each destination according to the unique configuration within the semiconductor device.

DETAILED DESCRIPTION

In the following detailed description, numerous specific details are set forth in order to provide a thorough understanding of the invention. However, the invention may be practiced without these specific details. In other instances, well-known methods, procedures, and/or components have not been described in detail so as not to unnecessarily obscure aspects of the invention.

Also, it is noted that the examples may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

In the following description, certain terminology is used to describe certain features of one or more embodiments of the invention For instance, the term "synchronization" or "synchronized" refers to the situation when the active edge of two or more clock signals are substantially the same. Synchronization does not require the clock signals to be exactly the same, but similar enough to fall within design requirements which may vary according to each application. The term "destination" refers to a device or group of devices. A "device" or "destination device" refers to circuitry requiring the clock signal and may include transmitters, receivers, and/or other circuitry.

One embodiment of the present invention provides a circuit for generating synchronized clock distribution to a plurality of destination devices The circuit includes an independent synchronization circuit (also referred to herein as "independent circuit") which provides synchronized clock distribution to a first destination and a dependent synchronization circuit (also referred to herein as "dependent circuit") which provides synchronized clock distribution to a second destination, The dependent circuit may be coupled to the independent circuit to provide synchronized clock distribution based on the synchronized clock distribution generated by the independent circuit.

Figure 1:
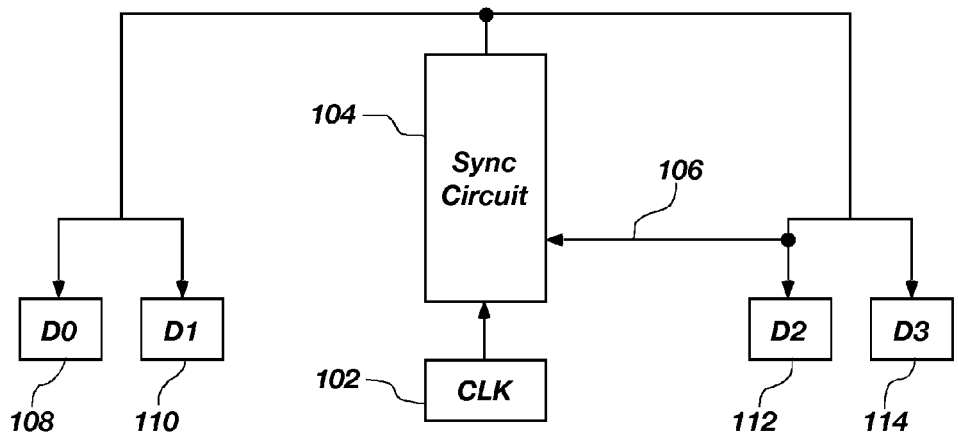
FIG. 1 illustrates an example of a prior art common synchronized clock distribution circuit.
Figure 2:
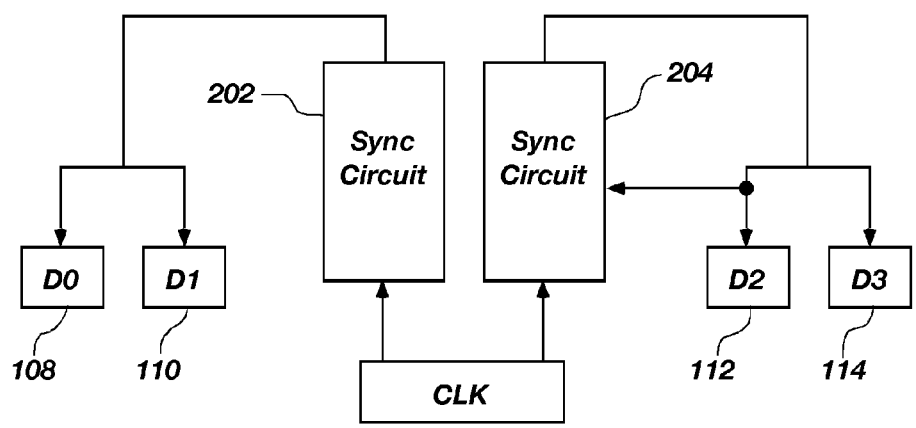
FIG. 2 illustrates an example of a prior art synchronized clock distribution circuit employing two independent synchronization circuits.
Figure 3:
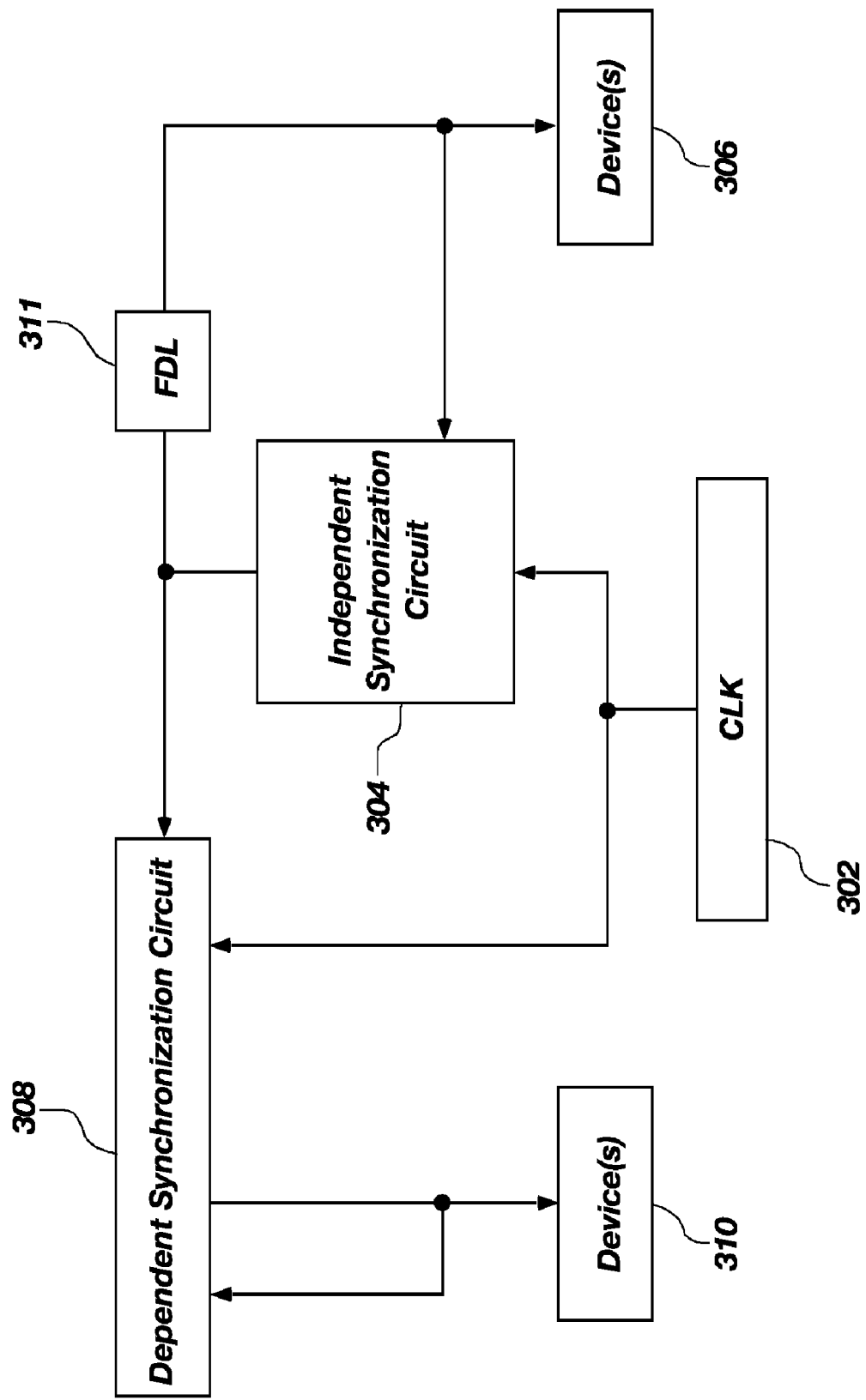
FIG. 3 is a block diagram illustrating the components of a multi-destination clock synchronization circuit, in accordance with an embodiment of the present invention.

Referring to FIG. 3, a block diagram is shown illustrating the components of a multi-destination clock synchronization circuit according to an embodiment of the present invention. A system clock 302 may be provided and may be an external or internal clock for synchronizing the flow of data to/from a semiconductor device, such as a memory device. The system clock 302 provides a source clock signal to an independent synchronization circuit 304. In one embodiment, the independent synchronization circuit 304 may be a DLL circuit configured according to one of the various suitable configurations known in the art for DLL circuits. In an alternate embodiment, the independent synchronization circuit 304 may be a PLL circuit configured according to one of the various suitable configurations known in the art for PLL circuits. The independent synchronization circuit 304 may generate a first destination clock signal that is synchronized with the source clock signal for a first destination 306. The first destination 306 may include a device or group of devices comprising transmitters, receivers, and/or other various circuitry.

A dependent synchronization circuit 308 is also provided. Like the independent synchronization circuit 304, the dependent synchronization circuit 308 may be a DLL circuit configured according to one of the various suitable configurations known in the art for DLL circuits. In an alternate embodiment, the dependent synchronization circuit 308 may be a PLL circuit configured according to one of the various suitable configurations known in the art for PLL circuits. The dependent synchronization circuit 308 may be coupled to the independent synchronization circuit 304 to receive the first destination clock signal generated by the independent synchronization circuit 304. The dependent synchronization circuit 308 may modify the first destination clock signal to generate a second destination clock signal which may then be synchronized with the source clock signal to provide synchronized clock distribution to a second destination 310. The second destination 310 may include a device or group of devices comprising transmitters, receivers and/or other various circuitry.

A fixed delay line 311 may be coupled between the independent synchronization circuit 304 and the first destination 306. The fixed delay line 311 may provide a fixed amount of delay to the first destination clock signal, such as to aid in the synchronization process of the dependent synchronization circuit 308.

Figure 4:
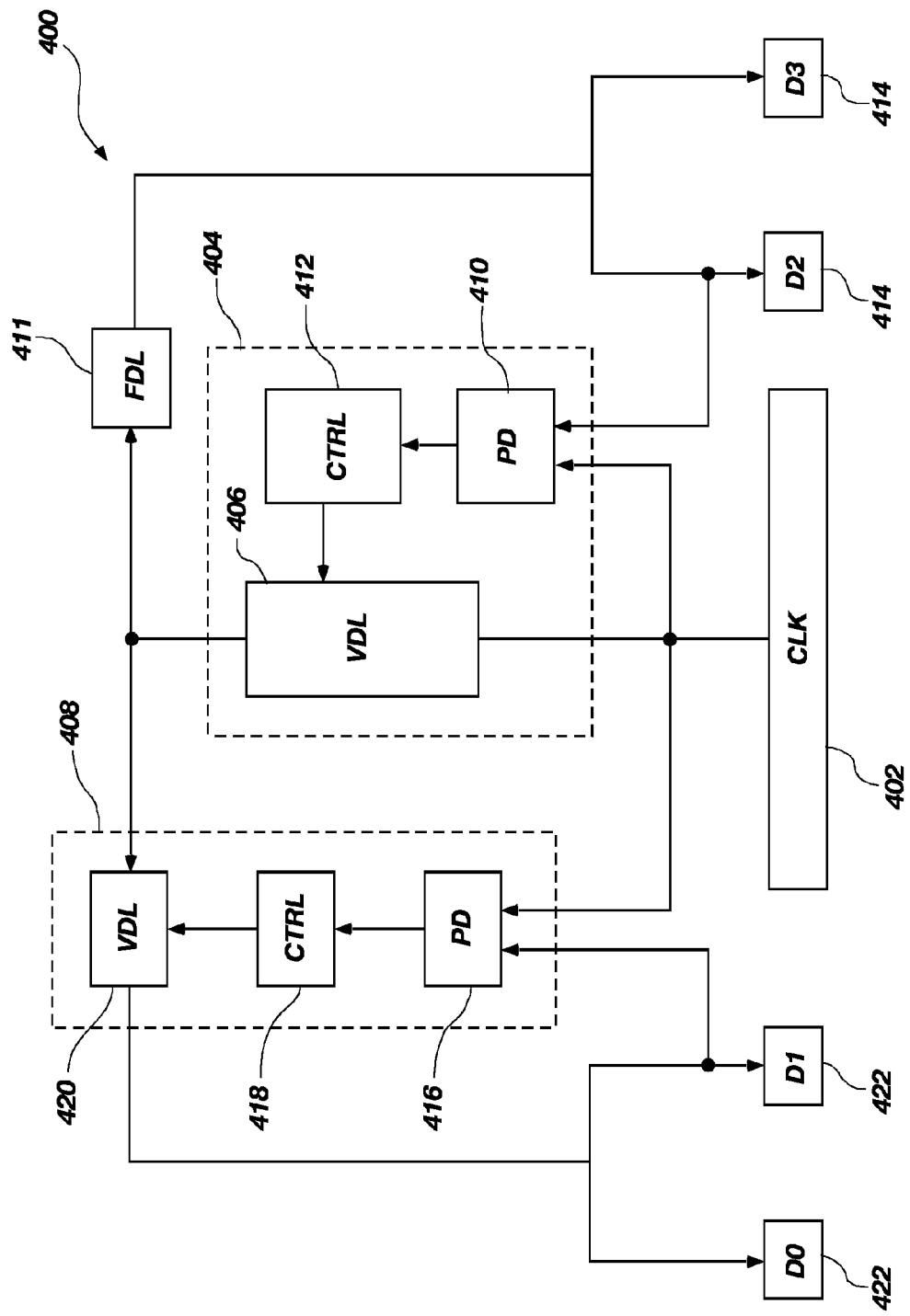
FIG. 4 is a block diagram illustrating a detailed example of a multi-destination clock synchronization circuit, in accordance wit another embodiment of the present invention.

Turning to FIG. 4, a block diagram is shown illustrating a detailed example of a multi-destination clock synchronization circuit 400 according to one embodiment of the present invention. A system clock 402 may be provided. The system clock 402 may provide a source clock signal to an independent synchronization circuit 404 and to a dependent synchronization circuit 408. The independent synchronization circuit 404 may include a variable delay line module 406, a phase detector module 410, a control module 412 and a fixed delay line 411.

The variable delay line module 406 may comprise a plurality of delay elements (not shown), such as, but not limited to, an inverter chain, resistors, and/or capacitors. The delay elements may be employed to modify the source clock signal received by the variable delay line module 406 through an input coupled to the system clock 402. The amount of modification, or the number of delay elements enabled/disabled, is determined by a signal received in a control terminal of the variable delay line module 406. The modified source clock signal, also known herein as a first destination clock signal, may be provided to an output of the variable delay line module 406.

The phase detector module 410 may be coupled to the system clock 402 for receiving the source clock signal. The source clock signal may be employed by the phase detector module 410 as a reference signal for synchronization purposes. The phase detector module 410 may be configured to receive a modified first destination clock signal in the second input. The modified first destination clock signal may be generated by passing the first destination clock signal through a fixed delay line 411. The phase detector module 410 may receive the two signals in the first and second inputs and may compare the phase difference of the two signals to determine whether to increment, decrement or lock the delay elements in the variable delay line module 406. The phase detector module 410 generates a control signal indicative of the phase difference between the modified source clock signal and the first destination clock signal and provides the control signal to the control module 412.

The control module 412 may generate a clock adjustment or clock modification signal in accordance with the control signal received from the phase detector module 410. The clock adjustment signal may be provided to an output coupled to the control terminal of the variable delay line module 406. The clock adjustment signal may enable or disable the delay elements in the variable delay line module 406 to modify the source clock signal. When the first destination 414 is substantially synchronized with the source clock signal the independent synchronization circuit 404 locks in place.

A fixed delay line 411 may also be positioned between the output of the variable delay line module 406 and the first destination 414. The fixed delay line 411 may comprise delay elements (not shown) similar to the delay elements in the variable delay line module 406, except the fixed delay line 411 delay elements are not controlled by the control module. The fixed delay line 411 may introduce a fixed amount of delay into the first destination clock signal to generate the modified first destination clock signal. The amount of delay may be determined by the dependent synchronization circuit 408 as will be described below. The modified first destination clock signal may be provided to the second input of the phase detector module 410 for synchronization as described above.

The multi-destination clock synchronization circuit 400 may also include a dependent synchronization circuit 408. The dependent synchronization circuit 408 may include a phase detector module 416, a control module 418 and a variable delay line module 420 in order to generate a second destination clock signal that is substantially synchronized with the source clock signal.

The phase detector module 416 may be similar to the phase detector module 410 in the independent synchronization circuit 404. The phase detector module 416 may include a first input coupled to the system clock 402 for receiving the source clock signal. A second input may be provided and configured to receive the second destination clock signal. The two signals in the first and second inputs may be compared for any phase difference. The phase detector module 416 may generate a control signal indicative of the phase difference between the source clock signal and the first destination clock signal and send the control signal to an output coupled to an input of the control module 418.

The control module 418 may be similar to the control module 412 of the independent synchronization circuit 404, except that the control module 418 may be smaller and include fewer components. By way of example and not limitation, the control module 418 may comprise a shift register comprised of flip-flops, as is known in the art, to control the variable delay line module 420 by selecting or deselecting delay elements. Since fewer delay elements may be required in the variable delay line module 420, as discussed in more detail below, the control module 418 may require fewer components (e.g., flip-flops) to control the fewer delay elements. Therefore, the control module 418 may be smaller than the control module 412. The control module 418 may receive the control signal generated by the phase detector module 416 and may generate a clock adjustment signal in accordance with the control signal. The clock adjustment signal may be provided to an output coupled to a control terminal in the variable delay line module 420.

The variable delay line module 420 may be similar to the variable delay line module 406, except that the variable delay line module 420 may be smaller and include fewer components. The variable delay line module 420 may have an input coupled to the output of the variable delay line module 406 and configured to receive the first destination clock signal. In his manner, the variable delay line module 420 receives a clock signal that is already substantially modified and may only need slight modification for synchronizing a second destination clock signal with the source clock signal. A plurality of delay elements (not shown) may be provided, such as, but not limited to, an inverter chain, resistors, and/or capacitors. The variable delay line module 420 may modify, as needed, the first destination clock signal by enabling or disabling the delay elements in accordance with the clock adjustment signal. The second destination clock signal may substantially synchronize a second destination 422 with the source clock signal.

Figure 5:
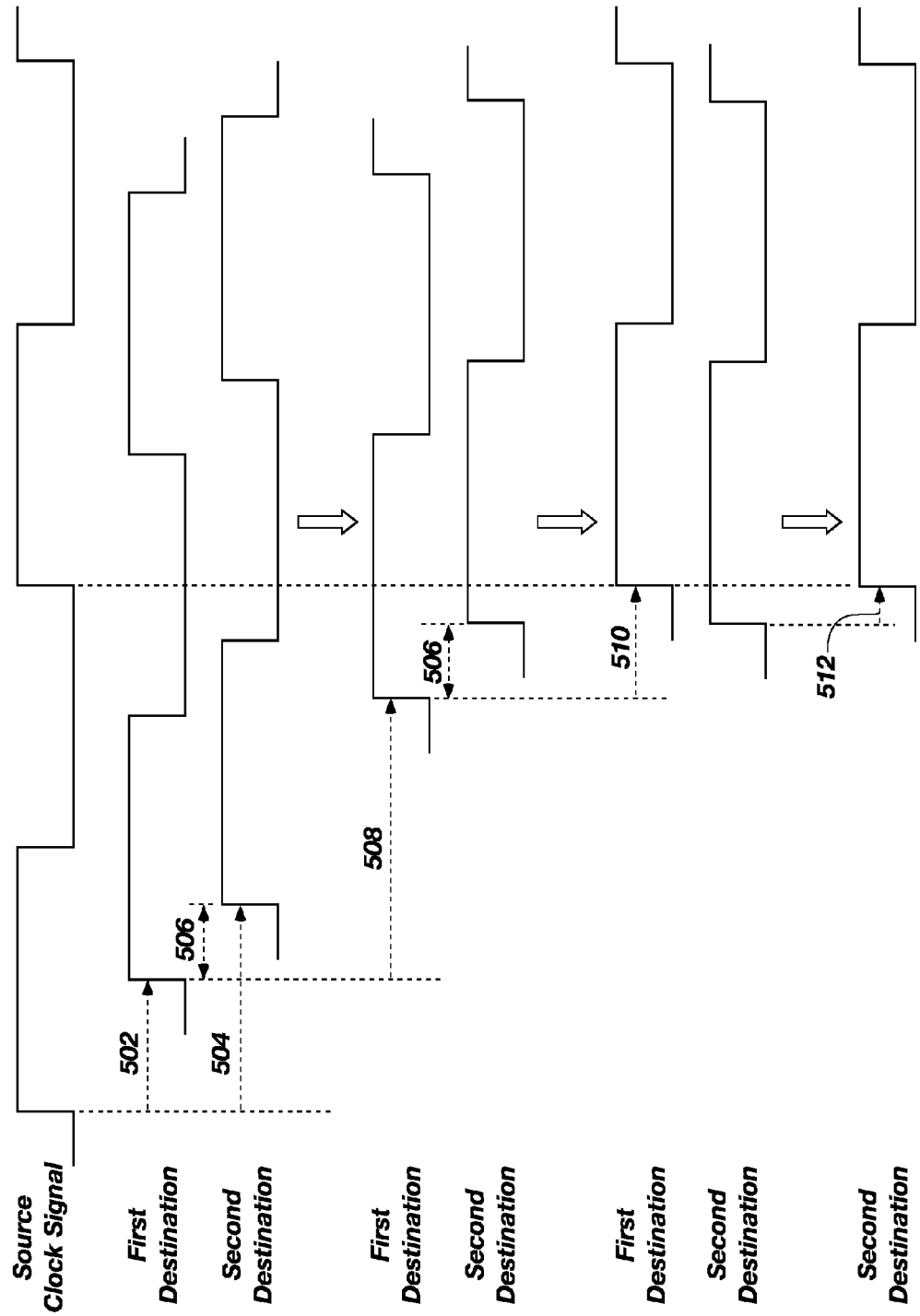
FIG. 5 is a timing diagram illustrating an example of the clock signals and their modification by the multi-destination clock synchronization circuit of FIG. 4.

Referring now to FIGS. 4 and 5, FIG. 5 is a timing diagram illustrating an example of the clock signals and their modification by the multi-destination clock synchronization circuit of FIG. 4. The source clock signal may be generated and provided to the first destination 414 and second destination 422. With no synchronization circuit, a delay 502 may be experienced between generating the source clock signal and its arrival at the first destination 414. A second delay 504 may be experienced between generating the source clock signal and its arrival at the second destination 422. There may be a difference in delay 506 between the first destination 414 and the second destination 422 caused by variations in placement, materials and components of the two destinations.

Employing the multi-destination clock synchronization circuit 400, the first destination clock signal may be synchronized with e source clock signal by employing the independent synchronization circuit 404. The variable delay line module 406 may introduce a delay 508 into the source clock signal, creating the first destination clock signal, which reduces the difference between leading edges of the first destination and the source clock signal. The dependent nature of dependent circuit 408 causes the delay 508 to automatically carry over into the second destination clock signal. The difference in delay 506 between the first destination 414 and the second destination 422 may, therefore, remain substantially the same.

The fixed delay line 411 may provide the additional delay 510 to the first destination clock signal, creating the modified first destination clock signal which may substantially synchronize the first destination 414 with the source clock signal. Because the fixed delay line 411 is employed after the first destination clock signal is provided to the dependent circuit 408, the delay 510 does not change the timing of the second destination clock signal. The dependent circuit 408 may be employed to provide the additional delay 512 necessary to substantially synchronize the second destination 422 with the source clock signal.

The additional delay 512 may be generated by the variable delay line module 420. Because the delay 512 may be substantially less than the delay 508 provided by the variable delay line module 406, the variable delay line module 420 may require fewer delay elements to adequately synchronize the second destination clock signal The use of fewer delay elements in variable delay line module 420 may also allow for a smaller control module since fewer control elements are required to enable or disable the fewer delay elements. Reducing the elements required in the variable delay line module 420 and the control module 418 may result in reduced use of real estate (chip space), reduced cost and reduced power consumption as compared to using two independent synchronization circuits.

In operation, the fixed delay line 411 may be configured to provide a delay based on the delay range in the variable delay line module 420. For example, the first destination clock signal may be substantially synchronized such that the difference between the source clock signal and the first destination 414 is ideally zero. The second destination 422 may have an additional delay of some amount, for example 100 picoseconds. The variable delay line 420 may, therefore, be configured to provide plus or minus 100 picoseconds of delay. This may be accomplished by providing sufficient delay elements to provide a total range of 200 picoseconds with the variable delay line module 420 set to operate normally with 100 picoseconds of delay, The fixed delay line 411 may also be configured to provide a fixed delay of 100 picoseconds. In this manner, if the first destination and second destination had exactly the same amount of delay from the source clock, the fixed delay line 411 and the variable delay line module 420 would cancel each other out. If, however, there is a difference between he two destinations, the variable delay line may adjust to minus 100 picoseconds or to plus 100 picoseconds in order to substantially synchronize the second destination clock signal which is dependent from the first destination clock signal.

Figure 6:
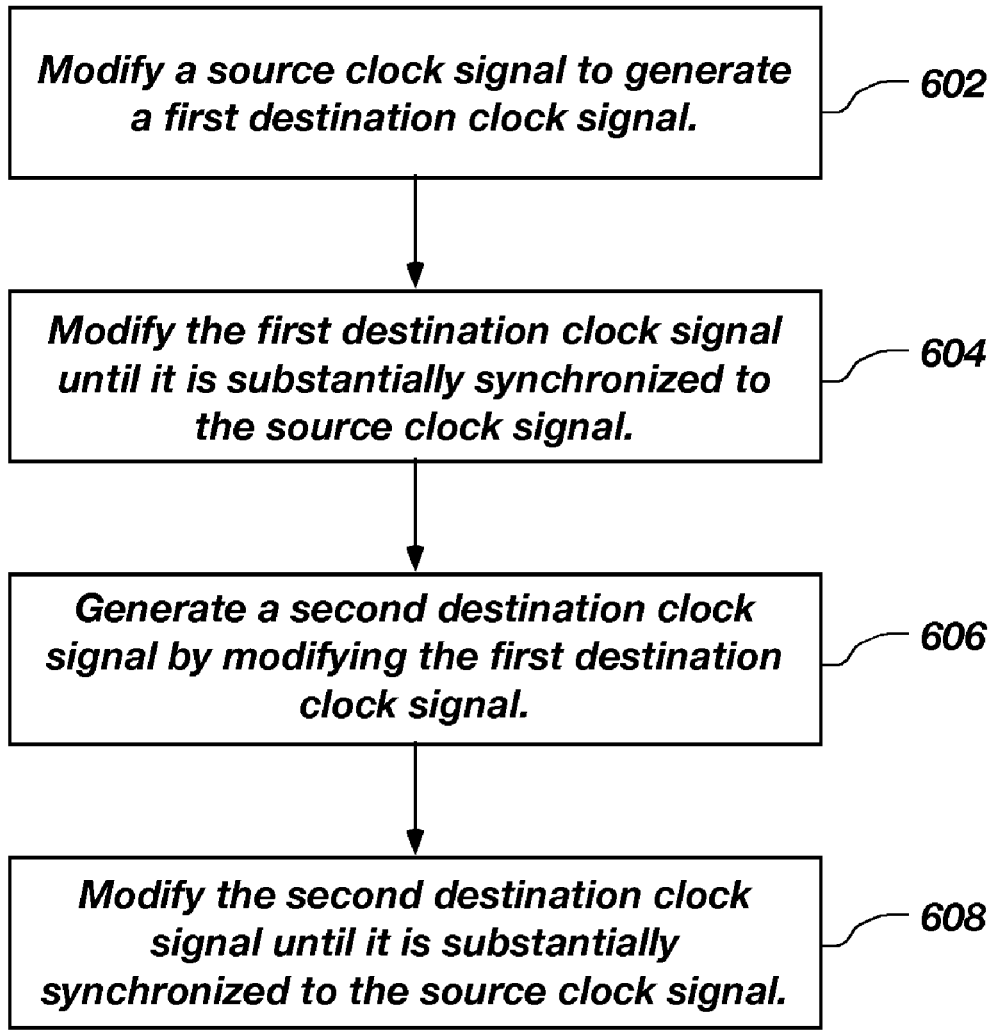
FIG. 6 is a flow diagram illustrating a method of operation of a multi-destination clock synchronization circuit, in accordance wit a further embodiment of the present invention.

FIG. 6 is a flow diagram illustrating a method of operation of a multi-destination clock synchronization circuit according to one embodiment of the present invention. A source clock signal may be modified through a first synchronization circuit to generate a first destination clock signal 602. The first synchronization circuit may be a DLL circuit configured according to any of the many suitable configurations known in the art for DLL circuits. In an alternate embodiment, the first synchronization circuit may be a PLL circuit configured according to any of the many suitable configurations known in the art for PLL circuits. The first destination clock signal 602 may be modified using the first synchronization circuit until the first destination clock signal 602 is substantially synchronized to the source clock signal 604. The first destination clock signal 602 may be provided to at least one first destination device.

A second destination clock signal may be generated by modifying the first destination clock signal 602 through a second synchronization circuit 606. The second synchronization circuit 606 may be a DLL circuit or a PLL circuit that is dependent to the first synchronization circuit. The second destination clock signal may be modified using the second synchronization circuit until the second destination clock signal is substantially synchronized to the source clock signal 608. The second destination clock signal may be provided to at least one second destination device.

Figure 7:
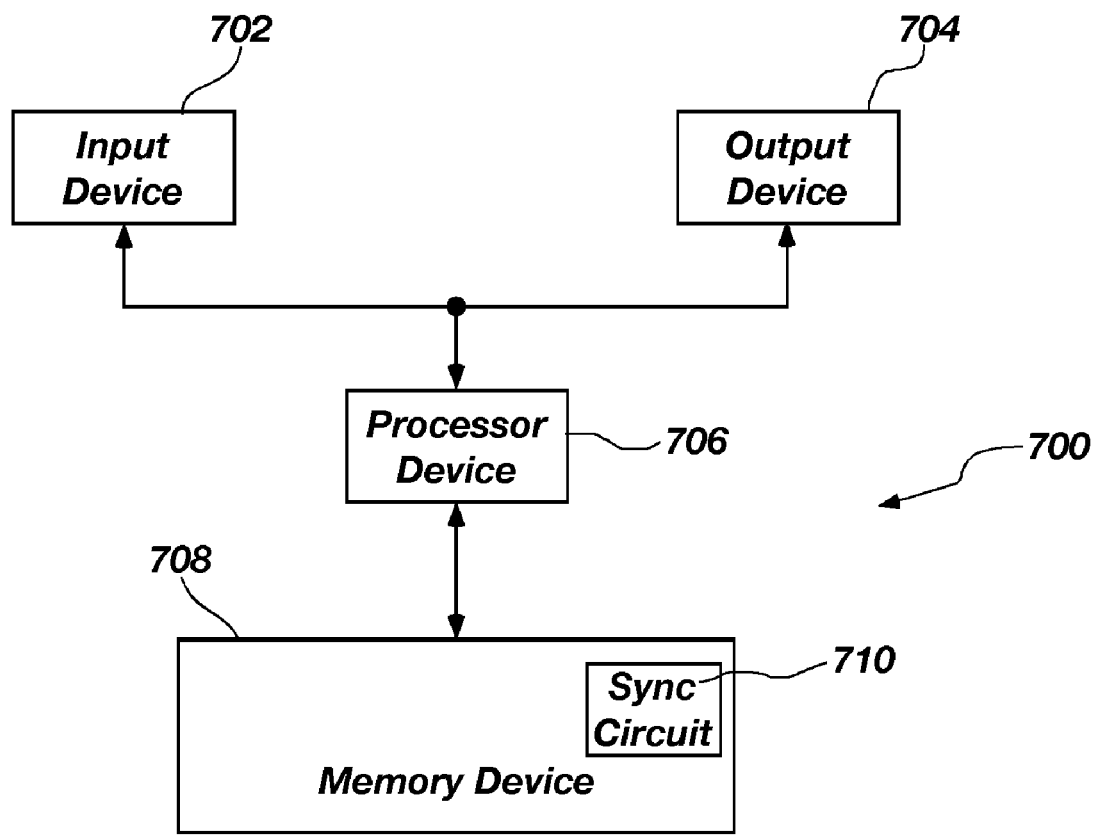
FIG. 7 is a system diagram, according to an embodiment of the present invention.

As shown in FIG. 7, an electronic system 700, such as a computer system, includes an input device 702, an output device 704, a processor device 706, and a memory device 708, such as a DRAM, SDRAM, DDR2 memory device, DDR3 memory device or other synchronous memory device. The memory device 708 includes a multi-destination clock synchronization circuit 710 configured in accordance with at least one embodiment of the multi-destination clock synchronization circuit described herein. It will be understood, however, that the multi-destination clock synchronization circuit 710 may also be incorporated into any one of the input, output, and processor devices 702, 704, and 706.

CONCLUSION

Various embodiments of the present invention are described above and directed toward embodiments of a synchronization method and apparatus and, specifically, an apparatus and method for providing synchronous clock distribution to a plurality of destinations. In one embodiment, a multi-destination clock synchronization circuit may be provided including an independent synchronization circuit and a dependent synchronization circuit. The independent synchronization circuit may be configured to generate a first destination clock signal substantially synchronized with a source clock signal. The first destination clock signal may be provided to a first destination. The independent synchronization circuit may include a first variable delay line module for adjusting or modifying the source clock signal to produce the first destination clock signal, a first phase detector module for comparing the phase difference between the source clock signal and the first destination signal, a first control module for enabling elements of the first variable delay line module and/or a fixed delay line for introducing a fixed amount of delay in the first destination clock signal.

In another embodiment, the dependent synchronization circuit may be dependently coupled to the independent synchronization circuit and configured to generate a second destination clock signal substantially synchronized with the source clock signal. The second destination clock signal may be generated by modifying the first destination clock signal. The dependent synchronization circuit may include a second variable delay line module for adjusting or modifying the first destination clock signal to produce the first destination clock signal, a second phase detector module for comparing the phase difference between the source clock signal and the second destination signal and/or a second control module for enabling elements of the first variable delay line module.

An embodiment of a method of clock synchronization for a plurality of destinations is also provided. The method includes modifying a source clock signal through a first synchronization circuit to generate a first destination clock signal, modifying the first destination clock signal using the first synchronization circuit until the first destination clock signal is substantially synchronized to the source clock signal, generating a second destination clock signal by modifying the first destination clock signal through a second synchronization circuit and modifying the second destination clock signal using the second synchronization circuit until the second destination clock signal is substantially synchronized to the source clock signal.

Those of ordinary skill in the art will further appreciate that the various illustrative logical blocks, modules, circuits, and algorithm operations described in connection with the examples disclosed herein may be implemented as electronic hardware, computer software, or combinations of both To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system.

While certain illustrative embodiments have been described and shown in the accompanying drawings, it is to be understood that such embodiments are merely illustrative of and not restrictive on the broad invention, and that this invention not be limited to the specific constructions and arrangements shown and described, since various other additions and modifications to, and deletions from same falling within the scope of the invention as hereinafter claimed, and legal equivalents thereof, will occur to those ordinarily skilled in the art.

What is claimed is:

1. A circuit, comprising:
    an independent synchronization circuit configured to receive a source clock signal and to generate a first destination clock signal substantially synchronized with the source clock signal, wherein the first destination clock signal is provided to a first destination; and
    at least one dependent synchronization circuit coupled to the independent synchronization circuit and configured to receive the source clock signal and the first destination clock signal, and to generate a second destination clock signal substantially synchronized with the source clock signal, wherein the second destination clock signal is provided to a second destination.

2. The circuit of claim 1, wherein the independent synchronization circuit comprises:
    a first variable delay line module having an input configured to receive the source clock signal, a control terminal and an output, the first variable delay line module configured to generate the first destination clock signal at the output;
    a first phase detector module having a first input configured to receive the source clock signal, a second input configured to receive the first destination clock signal and an output configured to provide a first control signal indicative of a phase difference between the source clock signal and the first destination clock signal;
    a first control module having an input coupled to the output of the first phase detector and an output coupled to the control terminal of the first variable delay line module, the first control module configured to provide a first clock adjustment signal in the output in accordance with the first control signal received in the input; and
    wherein the first variable delay line module adjusts the source clock signal in accordance with the first clock adjustment signal.

3. The circuit of claim 2, wherein the independent synchronization circuit further comprises a fixed delay line having an input coupled to the output of the first variable delay line and the input of the second variable delay line, the fixed delay line configured to provide a fixed amount of delay to the first destination clock signal.

4. The circuit of claim 3, wherein the fixed delay line comprises at least one delay element similar to an at least one delay element of the first variable delay line.

5. The circuit of claim 4, wherein the at least one delay element is not controlled by the first control module.

6. The circuit of claim 3, wherein the fixed amount of delay is determined by a range of delay in the dependent synchronization circuit.

7. The circuit of claim 2, wherein the dependent synchronization circuit comprises:
    a second phase detector module having a first input configured to receive the source clock signal, a second input configured to receive the second destination clock signal and an output configured to provide a second control signal indicative of a phase difference between the source clock signal and the second destination clock signal;

a second control module having an input coupled to the output of the second phase detector and an output, the second control module configured to provide a second clock adjustment signal in the output in accordance with the second control signal received in the input; and a second variable delay line module having an input configured to receive the first destination clock signal, a control terminal configured to receive the second clock adjustment signal, and an output configured to provide the second destination clock signal, the second variable delay line module configured to adjust the first destination clock signal in accordance with the second clock adjustment signal to produce the second destination clock signal.

8. The circuit of claim 7, wherein the first control module comprises a plurality of control module elements and the second control module comprises at least one control module element, the second control module comprising fewer control module elements than the first control module.

9. The circuit of claim 8, wherein the control module elements comprise flip-flops configured as a shift register.

10. The circuit of claim 7, wherein the first variable delay line comprises a plurality of delay line elements and the second variable delay line comprises at least one delay line element, the second variable delay line comprising fewer delay line elements than the first variable delay line.

11. The circuit of claim 10, wherein the delay line elements comprise at least one consisting of the list of invertors, resistors, and capacitors.

12. The circuit of claim 1, wherein the first destination includes at least one first destination device and the second destination includes at least one second destination device.

13. The circuit of claim 12, wherein the destination devices include at least one of transmitters and receivers.

14. The circuit of claim 1, wherein the at least one dependent synchronization circuit is adapted to generate the second destination clock by modifying the first destination clock signal.

15. The circuit of claim 1, wherein the independent synchronization circuit comprises a delay lock loop configuration.

16. The circuit of claim 1, wherein the independent synchronization circuit comprises a phase lock loop configuration.

17. A dependent clock synchronization circuit comprising:
a phase detector module having a first input configured to receive a source clock signal, a second input configured to receive a destination clock signal and an output configured to provide a control signal indicative of a phase difference between the source clock signal and the destination clock signal;
a control module having an input coupled to the output of the phase detector and an output, the control module configured to provide a clock adjustment signal in the output in accordance with the control signal received in the input; and
a variable delay line module having an input configured to receive a modified clock signal from an independent clock synchronization module, a control terminal configured to receive the clock adjustment signal from the control module output, and an output coupled to a first destination and to the second input of the phase detector module, the variable delay line module configured to adjust the modified clock signal in accordance with the clock adjustment signal to generate the destination clock signal which is sufficiently synchronized with the source clock signal.

18. The circuit of claim 17, wherein the control module comprises a shift register.

19. The circuit of claim 17, wherein the variable delay line module comprises at least one delay element.

20. The circuit of claim 19, wherein the at least one delay element comprises at least one of invertors, resistors, and capacitors.

21. The circuit of claim 17, wherein the first destination includes at least one first destination device.

22. The circuit of claim 21, wherein the at least one first destination device includes transmitters and receivers.

23. A method comprising:
modifying a source clock signal to generate, a first destination clock signal;
synchronizing the first destination clock signal to the source clock signal;
modifying the first destination clock signal, such that a second destination clock signal is generated;
comparing the second destination clock signal to the source clock signal; and
synchronizing the second destination clock signal to the source clock signal.

24. The method of claim 23, wherein modifying a source clock signal comprises modifying the source clock signal through a first synchronization circuit.

25. The method of claim 24, wherein synchronizing the first destination clock signal comprises modifying the first destination clock signal using the first synchronization circuit, such that the first destination clock signal is substantially synchronized to the source clock signal.

26. The method of claim 23, wherein modifying the first destination clock signal, such that a second destination clock signal is generated comprises modifying the first destination clock signal through a second synchronization circuit.

27. The method of claim 26, wherein synchronizing the second destination clock signal to the source clock signal comprises modifying the second destination clock signal using the second synchronization circuit.

28. The method of claim 23, further comprising providing synchronized clock distribution to at least one of a first destination device and a second destination device.

29. A system comprising a memory device, and a processor coupled to the memory device, at least one of the processor and memory device including a multi-destination clock synchronization circuit, the circuit comprising:
an independent synchronization circuit configured to receive a source clock signal and to generate a first destination clock signal substantially synchronized with the source clock signal, wherein the first destination clock signal is provided to a first destination; and
at least one dependent synchronization circuit coupled to the independent synchronization circuit and configured to receive the source clock signal and the first destination clock signal, and to generate a second destination clock signal substantially synchronized with the source clock signal, wherein the second destination clock signal is provided to a second destination.

30. The system of claim 29, wherein the memory device comprises a Synchronous Dynamic Random Access Memory (SDRAM).

* * * * *

UNITED STATES PATENT AND TRADEMARK OFFICE
CERTIFICATE OF CORRECTION

PATENT NO.       : 7,619,449 B2                                              Page 1 of 1
APPLICATION NO.  : 11/759782
DATED            : November 17, 2009
INVENTOR(S)      : Seong Hoon Lee It is certified that error appears in the above-identified patent and that said Letters Patent is hereby corrected as shown below:

In column 10, line 16, in Claim 23, delete "generate," and insert -- generate --, therefor.

Signed and Sealed this

Twelfth Day of January, 2010

David J. Kappos
*Director of the United States Patent and Trademark Office*